United States Patent
Wada et al.

(10) Patent No.: US 7,204,948 B2
(45) Date of Patent: Apr. 17, 2007

(54) RESIN APPLICATION METHOD ON PANEL, AND MANUFACTURING METHOD OF PANEL FOR DISPLAY

(75) Inventors: Kenya Wada, Ninomiyamachi (JP); Jun Onoshiro, Hiratsuka (JP); Kouji Hiraseko, Ninomiyamachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 404 days.

(21) Appl. No.: 10/445,958

(22) Filed: May 28, 2003

(65) Prior Publication Data
US 2004/0141109 A1    Jul. 22, 2004

(30) Foreign Application Priority Data
Dec. 26, 2002    (JP)    ............................. 2002-377632

(51) Int. Cl.
*B29C 65/40*    (2006.01)
(52) U.S. Cl. ...................................... 264/263
(58) Field of Classification Search ................ 264/263
See application file for complete search history.

(56) References Cited

U.S. PATENT DOCUMENTS

| 4,244,901 | A | * | 1/1981 | Wencley et al. ........... 264/46.4 |
| 4,857,376 | A | * | 8/1989 | Von Reis et al. ............. 428/83 |
| 4,914,883 | A | * | 4/1990 | Wencley .................... 52/309.5 |
| 5,188,693 | A | * | 2/1993 | Nagata et al. ......... 156/244.11 |
| RE37,341 | E | * | 8/2001 | Cornils et al. .............. 264/252 |

FOREIGN PATENT DOCUMENTS

JP        11-305245        11/1999

* cited by examiner

*Primary Examiner*—Edmund H. Lee
(74) *Attorney, Agent, or Firm*—Antonelli, Terry, Stout & Kraus, LLP.

(57) ABSTRACT

On an application stage of resin are provided two (2) sets of dispensers 20 and 40. The one dispenser 20 supplies the resin directing to an upper side corner on a liquid crystal cell 1, while the other dispenser 40 directing to a lower side corner thereon. The dispenser 40 has a syringe 41 and a needle-like nozzle 42, and the needle-like nozzle 42 emits the resin, directing upward obliquely, onto the lower side corner. Thereby, the resin can be supplied between an edge portion of a lower substrate and a lower surface of a connecting board, but without turning over the panel for display, such as, a liquid crystal cell, etc.

8 Claims, 3 Drawing Sheets

RESIN APPLICATION METHOD ON PANEL, AND MANUFACTURING METHOD OF PANEL FOR DISPLAY

BACKGROUND OF THE INVENTION

The present invention relates to a method for applying resin on a connecting portion with a substrate of a panel, for the purpose of strengthening the connecting substrate connected to the panel for display, in particular in a liquid crystal display apparatus and/or a plasma display apparatus, etc., and it also relates to a manufacturing method of the panel for display, on which the resin is applied in such the manner, and further to an apparatus for applying the resin onto the connecting portion with the substrate of the panel.

Conventionally, a panel for display is constructed to be a liquid crystal cell of enclosing or encapsulating liquid crystal between two (2) pieces of glass substrates, which are disposed vertically. Between those two (2) pieces of the glass substrates building up the liquid crystal cell, the one of glass plates (being called by a lower substrate, normally) is made larger in sizes thereof than the other glass plate (being called by an upper substrate, with respect to the lower substrate), and onto two (2) sides of the lower substrate are connected circuit boards for driving thereof. Though each of the circuit boards is constructed with a printed circuit board (PCB), however for the purpose of limiting width of a frame within the liquid crystal display apparatus, it is attached with bending the printed circuit board. For this reason, connection between the liquid crystal cell and the printed circuit board is made by means of a flexible board, however as such the flexible board, there are various kinds, including one mounting ICs thereon, and one, on which only wiring patterns are provided, while mounting the ICs on the lower substrate thereof, etc.

FIG. 3 shows the structure, in which the flexible board mounting the ICs thereon is connected between the liquid crystal cell and the printed circuit board. In the figure, a reference numeral 1 indicates the liquid crystal cell, and this liquid crystal cell 1 has a lower substrate 2 and an upper substrate 3, both of which are made from glass substrates. For example, in a liquid crystal display of TFT type, the lower substrate 2 is a TFT substrate, while the upper substrate 3 a color filer. And, between both of those substrates 2 and 3 is enclosed or encapsulated liquid crystal. On the lower substrate 2 are formed transistors in a matrix manner, and for drawing out wirings 7 (see FIG. 4) connected with those transistors, it is expanded or projected only by a predetermined width from the upper substrate 3, at least on the two (2) sides thereof, neighboring with each other. To each of those wirings 7 is electrically connected with an electrode 8 (see FIG. 4) provided on the flexible board 4 mounting an IC 4a thereon. And, to electrodes on the other side of the flexible board 4 is connected a printed circuit board 5. Herein, the wirings 7 of the lower board 2 are formed as a group, being made up with a predetermined number thereof, and the flexible boards 4 are attached in a plural number thereof for each of those wiring groups.

Upon attaching each of the flexible boards 4 onto the lower board 2, as shown in FIG. 4, for the purpose of connecting the electrodes 8 provided on the flexible board 4 to the wirings 7 formed on the lower substrate 2, electrically, it is conducted through a ACF tape 6. The ACF tape 6 is made by dispersing minute conductive particles 6a on adhesive binder resin 6b, and this ACF tape 6 is pasted on the lower substrate 2, in advance, thereby covering over a portion of the wirings 7. Then, the flexible board 4 is positioned with respect to the lower substrate 2, and is attached on the ACF tape, and further the thermo-compression bonding is conducted thereon. With this, the binder resin 6b is thermally cured, and thereby the flexible board 4 is fixed onto the lower substrate 2, and also the conductive particles 6a are put between the wiring 7 and the electrode 8, thereby making up electrical connection between them.

Herein, almost of a part of the projection portion 2a of the lower substrate 2, which builds up the liquid crystal cell 1, is covered by the flexible boards 4, however a gap is produced somewhat between an edge portion of the flexible board 4 and an edge portion of the upper substrate 3. Covering the portion of that gap by resin enables to protect the wirings 7 and the electrodes 8, thereby obtaining measure for preventing foreign matters or the like from entering into from the gap defined therebetween. In more details, with disposing a dispenser having a needle-like nozzle directing to a corner portion between the projection portion 2a of the lower substrate 2 and the edge portion of the upper substrate 3 in the liquid crystal cell 1, dissolved resin is applied from the nozzle to the corner portion mentioned above while moving the liquid crystal cell 1 and the nozzle, relatively, and then the resin is cured through air drying or under the ultraviolet (UV) lights, etc.

Herein, in the liquid crystal cell, conventionally, it is already known such the structure, such as in Japanese Patent Laying-Open No. 11-30524 (1999), for example, in particular on page 4 and in FIG. 1 thereof <Patent Document 1>, that the resin is applied, not between the lower substrate and the flexible board, but at the corner portion of connecting portion between the upper substrate and the lower substrate, with using the dispenser, while positioning the needle constructing the dispenser under the condition of non-contact with the corner portion of the upper and lower substrates, and then the needle is moved while supplying the resin thereon.

However, since the ACF tape 6 has the predetermined size of width, then under the condition where it is pasted on the lower substrate 2, and therefore it cannot reach to the edge portion of the lower substrate 2. The flexible board 4 is piled upon the lower substrate 2, and a middle portion of the piled-up is adhered fixedly by the ACF tape 6, however there are produced still potions at both sides of the fixing portion, where it is only in contact with the lower substrate 2. For this reason, there is possibility that the flexible board 4 floats up from the surface of the lower substrate 2, thereby bringing about probability that foreign matters are mixed into therebeween, or that the flexible board 4 or the printed circuit board 5 connected with the flexible board 4 is exfoliated by an external force acting thereon, etc.

For the above reasons, it is preferable that the resin is supplied to the corner portion defined by the lower surface of the flexible board 4 and the edge portion of the lower substrate 2, so that the flexible board 4 will not rise up from the lower substrate 2. However, in case of trying to supply the resin by using such the dispenser, as was mentioned previously, first the needle-like nozzle is positioned at the corner portion of the upper substrate 3 on the surface side of the lower substrate 2, so as to supply the dissolved resin thereto, and thereafter the liquid crystal cell 1 is turned upside down, so that the needle-like nozzle is directed to between the edge portion of the lower substrate 2 and the lower surface of the flexible boards, to supply the dissolved resin from that nozzle.

However, with such the method as was mentioned above, it is necessary to turn the liquid crystal cell 1 from the condition that the lower substrate 2 is positioned below into the condition that it comes upward, once, to supply the resin thereupon, and thereafter it must be turned over, again, so that the upper substrate 3 comes above. Accordingly, it needs a mechanism for turning-over the liquid crystal cell 1, and therefore has a drawback that, not only being complex in the structure thereof, but also that it takes a long time for processing, etc.

BRIEF SUMMARY OF THE INVENTION

The present invention is made for dissolving such the drawbacks, as was mentioned previously, and an object thereof is, according to the present invention, to provide a method and an apparatus, enabling supply of resin between the edge portion of the lower substrate and the lower surface of a connecting board, but without a necessity of turning-over the panel for display, such as, of a liquid crystal cell, etc.

For accomplishing the object mentioned above, according to the present invention, first, there is provided a resin applying method on a panel, for applying resin to a corner portion where a connecting board is guided out from an end portion of the panel for display, after piling up the connecting board, partially, upon a surface at an edge portion of said panel for display, comprising the following steps: a step for disposing-a dispenser below said connecting board and applying resin directing to a corner portion at a lower side, which is defined by the connecting board and the edge surface of the panel, while moving said panel and said dispenser, relatively; and a step for drying the resin applied thereon.

The dispenser is disposed to direct upwards obliquely with respect to between the panel and the edge portion of the connecting board, thereby to supply the resin thereto. Since the resin supplied from the dispenser is in the dissolving condition and also it has a certain degree of viscosity, then it is possible to supply the resin at a predetermined position with certainty, by supplying the resin from position of the dispenser, coming close to the panel and the connecting board under non-contact condition therewith.

Herein, the connecting board may be a printed circuit board mounting wiring patterns and electronic parts on a board of synthetic resin thereof, or it may be constructed with a bendable flexible board, anyway, irrespective of mounting electronic parts thereon or not. And, in a case where a plural number of flexible boards are connected on the edge portion of the panel at a predetermined pitch distance therebeween, the resin is applied from the dispenser to each connecting portion for each of the flexible boards, intermittently. Also, in a case where the position of application of resin is limited to a narrow region at the corner, the supply portion of resin in the dispenser is made up from a needle-like nozzle. When applying the resin, either one of the panel or the dispenser is moved, however, by attaching the panel onto a transfer means, it is possible to move the panel in the direction of application lines of resin, by the function of the transfer means, thereby to supply the resin from the dispenser directing to the lower surface of the connecting board.

Also, according to the present invention, there is provided a method for applying resin onto an upper side corner, being defined between a projection portion of a lower substrate and an upper substrate, and a lower side corner of a draw-out portion of the lower substrate from a flexible board, on a panel being made up with two pieces of substrates, in which at least two sides of the lower substrate are projected from the upper substrate and are attached with a plural number of flexible boards at the projection portions of the lower substrate, at a predetermined pitch distance therebwtween, comprising the following steps: disposing dispensers for applying the resin, at said upper side corner and said lower side corner, both under non-contacting condition therewith; applying the resin directing from each of said dispensers to said upper side corner or said lower side corner, respectively, during when either one of said panel or said dispenser is moved with respect to the other; applying the resin almost uniformly over a total length of said panel, on the upper side corner; and applying the resin onto each attaching portion of each of said flexible boards, on the lower side corner.

Further passing through various steps after applying the resin in the manner mentioned above, it is possible to manufacture the panel for display, and a method for manufacturing the panel for display, being characterized by the application of resin, in this manner, is the invention described in the now pending claims 4–6.

Further, according to the present invention, there is also provided a resin applying apparatus on a panel, for applying resin to a corner portion where a connecting board is guided out from an edge portion of the panel, for display, after piling up the connecting board, partially, upon a surface at the edge portion of said panel for display, comprising: a needle-like nozzle, being provided directing upward obliquely, so that an emission opening thereof is directed to the corner defined between the edge portion of said panel and the lower surface of said connecting board; a syringe for reserving the resin under dissolving condition, in which the resin flows out from a lower side thereof; a flow passage of the resin, being connected between said syringe and said needle-like nozzle; a suppressing means for sending the resin to said needle-like nozzle with pressure, by applying pressure onto liquid surface within said syringe; and a control means for controlling the emission of the resin from said needle-like nozzle, as well as, stoppage thereof.

Furthermore, according to the present invention, there is provided a resin applying apparatus, for applying resin onto an upper side corner defined between a projection portion of a lower substrate and an upper substrate, and a lower side corner of a draw-out portion of the lower substrate from a flexible board, in particular, on a panel being made up with two pieces of substrates, in which at least two sides of the lower substrate are projected from the upper substrate and are attached with a plural number of flexible boards at the projection portions of the lower substrate at a predetermined pitch distance therebwtween, comprising: a first and a second dispensers, being disposed for applying the resin, at said upper side corner and said lower side corner, under non-contacting condition therewith, wherein each of those first and second dispensers is constructed with a syringe and a needle-like nozzle, respectively; the second dispenser for supplying the resin onto said lower side corner is provided with a flow passage for changing the resin supplied from a lower side of said syringe into a direction, directing upwards obliquely, by means of the needle-like nozzle; either one of said panel or said dispensers is made to move relatively with respect to the other by means of a transfer means; said first dispenser for applying the resin onto the upper side corner is so controlled that the resin is applied almost uniformly over a total length of said panel by means of a first control means; and said second dispenser for applying the resin onto the lower side corner is so controlled that the resin is applied onto each attaching portion of each of the flexible boards, by means of a second control means.

BRIEF DESCRIPTION OF THE SEVERAL VIEWS OF THE DRAWING

Those and other objects, features and advantages of the present invention will become more readily apparent from the following detailed description, when taken in conjunction with the accompanying drawings, wherein.

DETAILED DESCRIPTION OF THE INVENTION

Figure 1:
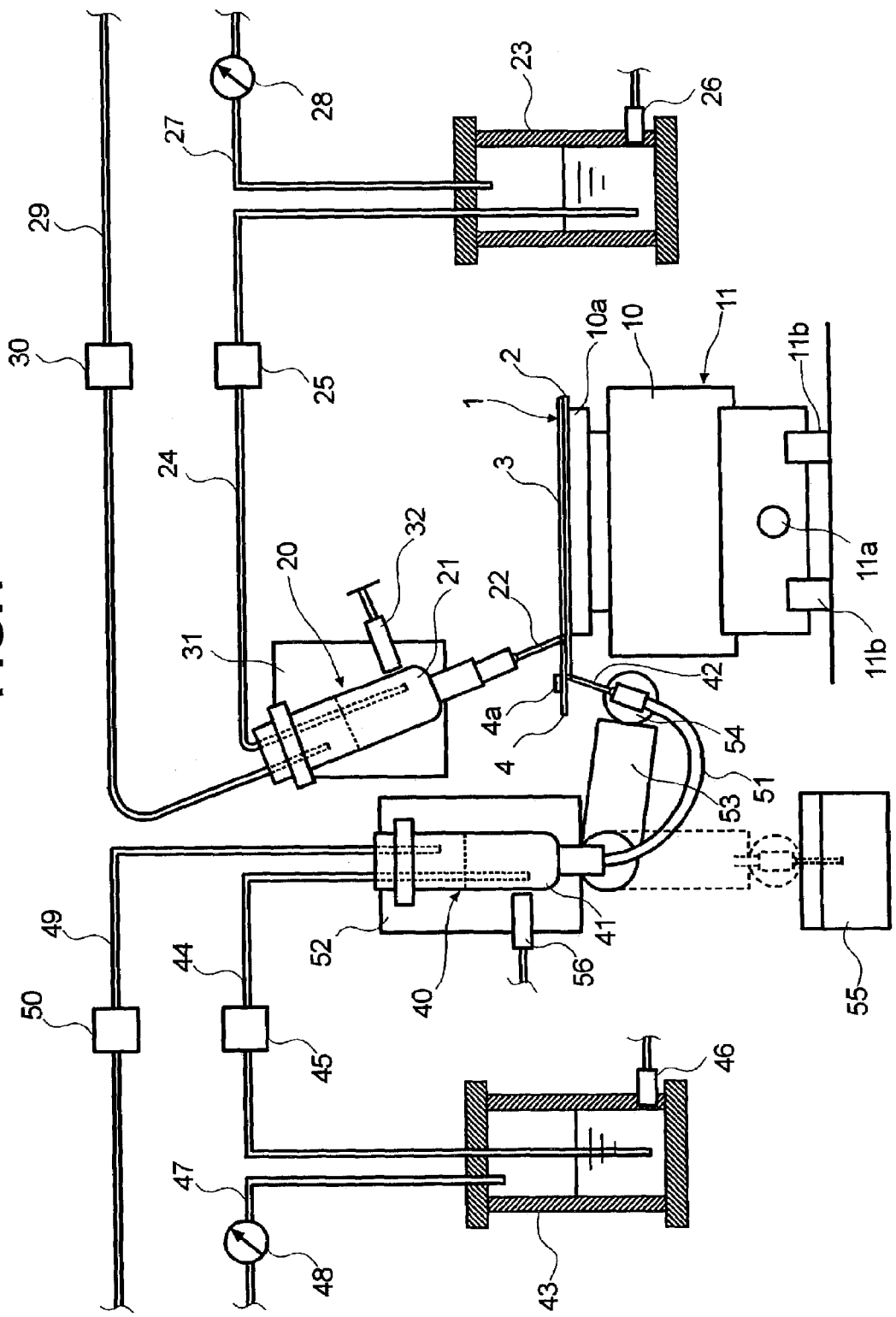
FIG. 1 is a view for explaining the structure of a resin applying system onto a liquid crystal cell, for showing an embodiment according to the present invention.
Figure 2:
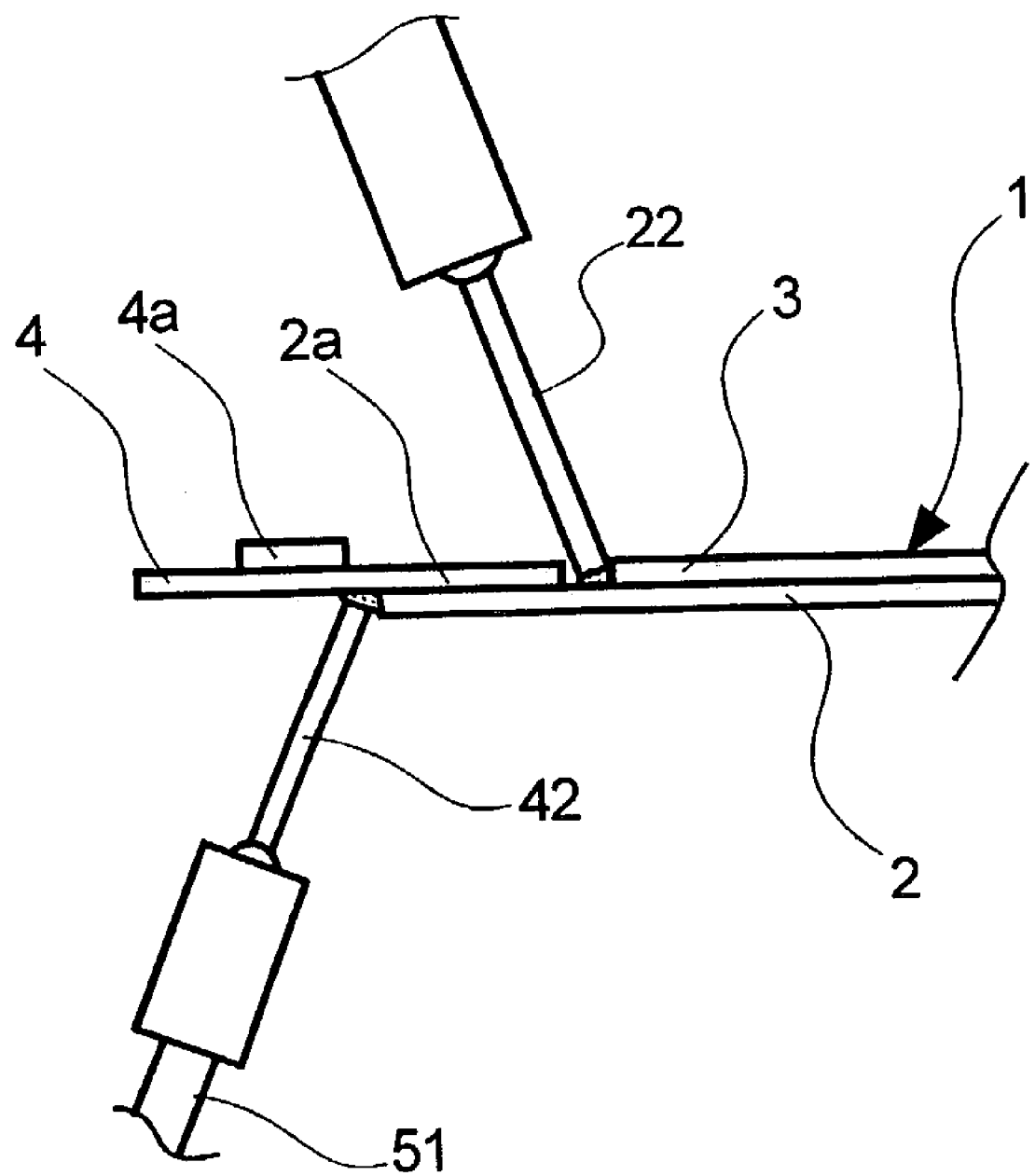
FIG. 2 is an explanatory view of function, in particular for showing the condition of applying resin onto the liquid crystal cell.
Figure 3:
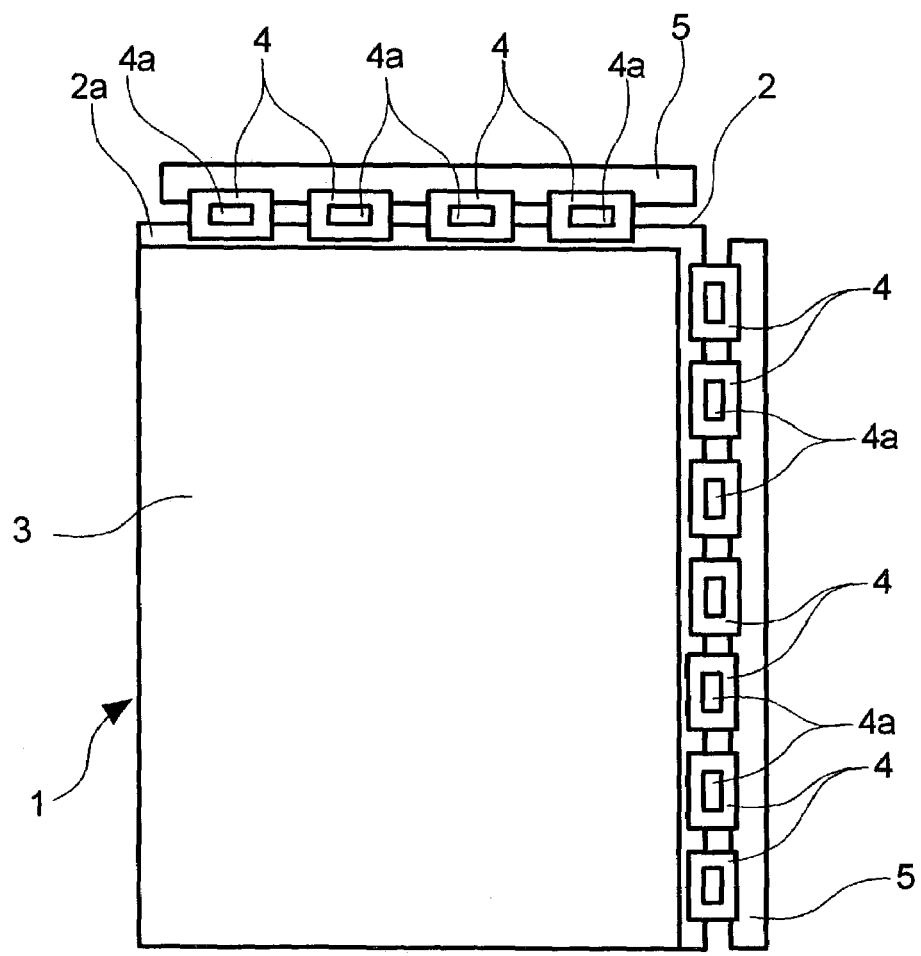
FIG. 3 is a plane view for showing the condition where flexible boards and printed circuit boards are connected to the liquid crystal cell, each in the form of a connecting board therebetween, as an example of the panel for display.
Figure 4:
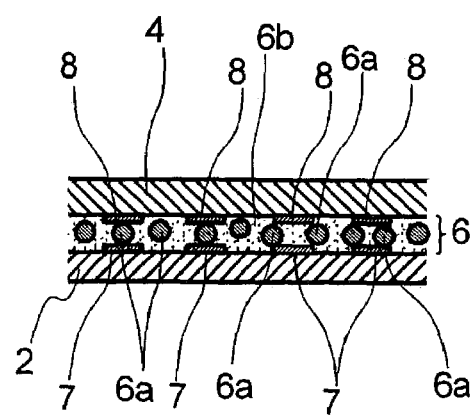
FIG. 4 is a cross-section view of a connection portion between lower substrate of the liquid crystal cell and the flexible board.

Hereinafter, an embodiment according to the present invention will be fully explained by referring to the attached drawings, FIGS. 1 and 2. In FIG. 1, the same elements shown in FIG. 3 are depicted with using the same reference numerals attached thereto. Accordingly, to the liquid crystal cell 1 made up with the lower substrate 2 and the upper substrate 3 is connected the flexible board 4 mounting the IC 4a thereupon, and under this condition, the liquid crystal cell 1 is held on a table 10a provided on a position adjustment base 10, fixedly by means of, such as, vacuum absorption, etc., for example. And, the position adjustment base 10, as a transfer means, is made transferable in a direction perpendicular to a plane of paper of FIG. 1, by means of a linear guide means 11, which is constructed with a screw shaft 11a and a guide rail 11b, for example. In the same drawing, there is also shown an application stage of resin, and though not shown in the figure, in a front side of the application stage is provided a stage, for the purpose of positioning the liquid crystal cell 1 thereon.

On the application stage for resin, there are provided two (2) sets of dispensers 20 and 40. The one dispenser 20 (i.e., a first dispenser) is provided for supplying resin towards an upper side corner portion defined between an edge surface of the upper substrate 3 and the projection portion 2a of the lower substrate 2 in the liquid crystal cell 1, and the other dispenser 40 (i.e., a second dispenser) is for supplying resin toward a lower side corner portion, i.e., the corner portion defined between an edge surface of the lower substrate 2 and the lower surface of the flexible board 4.

Each the dispenser 20 or 40 comprises a syringe 21 or 41, into which the resin is introduced under the dissolving condition, and a needle-like nozzle 22 or 42 for supplying the resin from the syringe 21 or 41 towards the liquid crystal cell 1, respectively. Also, there is provided a resin liquid tank 23 or 24 for supplying the resin to the syringes 21 or 41, respectively, and a conduit 24 or 44 is connected between the resin liquid tank 23 or 43 and the syringe 21 or 41, respectively. Moreover, on the way of each the conduit 24 or 44 is provided a control valve 25 or 45, and further a liquid surface sensor 32 or 56 is provided in each the syringe 21 or 41. Accordingly, by the function of the liquid surface sensor 32 or 56, the control valve 25 or 45 is opened when the resin within the syringe 21 or 41 comes down to be equal or lower than a predetermined level, thereby conducting supply of the resin from the resin liquid tank 23 or 43 to the syringe 21 or 41. Further, in each resin liquid tank 23 or 43 is provided a heating means (not shown in the figure), thereby keeping the viscosity of resin at constant. It is preferable to provide a heating means for adjusting the viscosity of resin, also within an inside of each the syringe 21 or 41, depending upon necessity thereof.

For the purpose of supplying the resin from the syringe 21 and/or 41 to the liquid crystal cell 1, there is provided means for suppressing the liquid surface within the syringe 21 and/or 41. This means is constructed with conduits 29 and 49 connecting between an inert gas supply source of, such as, an inter gas bomb (not shown in the figure), and the upper surface of the liquid within the syringes 21 and 41, and further controllers 30 and 50, each of which is provided on the way of the conduit 29 or 49. Each the controller 30 or 50 controls the pressure (and a flow rate) of the resin emitted from the syringe 21 or 41 toward the liquid crystal cell 1, through the needle-like nozzle 22 or 42, and also conducts control between supply and stoppage thereof. The control on emission pressure of resin is achieved through the supply pressure of the inert gas (in more details, such as, nitrogen gas, for example), and also controlling on the supply and stoppage thereof is achieved through the conduit 29 or 49; i.e., exchanging it in the condition of supplying the pressure into the syringe 21 or 41 therethrough, or the condition of cutting-off the supply of that pressure.

Further, also for the purpose of conducting resin supply from the resin liquid tanks 23 and 43 to the syringes 21 and 41, it is so constructed that suppression can be made upon the liquid surfaces within the resin liquid tanks 23 and 43. For this reason, to each the resin liquid tank 23 or 43 is connected a conduit 27 or 47, so that the one end thereof faces onto the liquid surface of the resin liquid surface, while the other end of the conduit 27 or 47 is connected with a supply source of inert gas (such as, nitrogen gas, for example). And, in order to control the emission pressure when supplying the resin from the resin liquid tank 23 or 43 to the syringe 21 or 41, there is provided an emission pressure controller 28 or 48. Herein, preferably, the liquid surface within the resin liquid tank 23 or 43 is always kept under the condition of being suppressed. As a result of this, the control valve 25 or 45 is opened whenever the liquid surface level comes down a little bit within the syringe 21 or 41, therefore it is possible to supply the resin into the syringes 21 or 41, thereby controlling the liquid surface within the syringe 21 or 41 almost at a constant.

The needle-like nozzle 22 in the dispenser 20 is directed obliquely downward, and therefore the needle-like nozzle 22 is directly connected to the syringe 21. And, in order to adjust the position and an angle of a tip emission portion of the needle-like nozzle 22, the syringe 21 directly connected to this needle-like nozzle 22 is attached to a position adjustment means 31, and by the function of this position adjustment means 31, it is possible to make an adjustment on position of the tip emission portion of the needle-like nozzle 22.

On a while, with the needle-like nozzle 42 in the dispenser 40, the tip emission portion thereof is directed obliquely upward on the lower surface of the flexible board 4, since it is directed to the corner portion defined between the end surface of the lower substrate. On the contrary to this, with the syringe 41, the resin supply thereto is directed downward due to the fact that the liquid surface is suppressed. Accordingly, a supply passage of resin from the syringe 41 to the needle-like nozzle 42 must be changed in the direction, from the lower end portion of the syringe 41 to the needle-like nozzle 42 directed obliquely upward. For this reason, it is impossible to connect the needle-like nozzle 42 to the syringe 41, directly, therefore the connection is made between the syringe 41 and the needle-like nozzle 42 by means of a flexible tube, as the supply flow passage for the resin. The syringe 41 is attached to the position adjustment means 52, in the similar manner to the syringe 21, and further the needle-like nozzle 42 is connected to a wrist portion 54 at the tip of a swing arm 53, which is provided on the position adjustment means 52. And, at the lower position of the position adjustment means 52 is provided a solvent tank 55. During repetition of emission and stoppage of the resin from the needle-like nozzle 42, the resin stays at periphery of an emission outlet of the needle-like nozzle 42 directing upward. Then, the needle-like nozzle 42 can be made cleaning at the tip portion thereof, by dipping the tip portion of the needle-like nozzle 42 into the solvent tank 55.

Furthermore, in FIG. 1, reference numerals 26 and 46 indicate liquid surface sensors, each of which is attached onto the resin liquid tank 23 or 43 for detecting a fact that the liquid surface within the resin liquid tank 23 or 43 comes down to the lowest one, and generates alarm when the liquid surface within the resin liquid tank 23 or 43 comes down to the lowest, thereby requiring supply of the resin.

Explanation will be given on a method for applying the resin onto the liquid crystal cell 1, by using the supply system of resin, which is constructed in the manner mentioned above.

The liquid crystal cell 1, being attached with a plural number of flexible boards 4 thereon, is fixed on the table 10a of the position adjustment base 10 under the condition that the lower substrate 2 thereof adheres on it through vacuum, so as to be adjusted to comes to a predetermined position on the positioning stage, and thereafter it is transferred up to an application stage of resin. On the application stage of resin, since adjustment was alredy made on the positions of the dispensers 20 and 40 by means of the position adjustment means 31 and 52, and when the liquid crystal cell 1, on which the position adjustment was made, advances on the position adjustment base 10, each one of the emission outlets of the needle-like nozzles constructing the dispensers 20 and 40 comes to face onto a predetermined position with respect to the liquid crystal cell 1. Namely, the needle-like nozzle 22 faces to the upper side corner portion defined between the end surface of the upper substrate 3 and the projection portion 2a of the lower substrate 2, while the needle-like nozzle 42 to the lower side corner portion defined between the flexible board and the edge portion of the lower substrate 2, on the lower surface of the flexible board 4.

Herein, the needle-like nozzles 22 and 42 are in the condition of non-contact with the respective corner portions mentioned previously, and they are held at the positions in the vicinity to those. And, the distance separating from them is almost corresponding to an amount of application of resin. Accordingly, for making the resin amount to be applied large, the needle-like nozzles 22 and 42 are separated from the liquid crystal cell 1, to be acted with high emission pressure thereupon, while in case of making the resin apply amount small, the emission pressure of resin is made low, in the similar manner, by separating the needle-like nozzles 22 and 42 from the liquid crystal cell 1. The distance separating from the corner potion can be set, individually, for the needle-like nozzles 22 and 42, by means of the respective position adjustment means 31 and 51, respectively.

Herein, since the upper side corner portion between the lower substrate 2 and the upper substrate 3 covers the full length of the liquid crystal celll, the resin is emitted from the needle-like nozzle 22 at the position opposing to the liquid crystal cell 1, and the condition of applying the resin onto the upper side corner portion is continued up to when the liquid crystal cell 1 passes by. When the liquid crystal passes through, then the emission of resin is stopped. This control is conducted by means of the controller 30, and in more details thereof, in order to start the emission of resin, the conduit 29 is connected to the supply source of the inert gas, for applying pressure onto the liquid surface within the syringe 21, while in case of stopping the emission, the connection is cut off with the supply source of the inert gas, thereby bringing an inside of the conduit into condition of being closed or sealed up.

On the other hand, since the flexible boards 4 are attached intermittently to the lower substrate 2, at a predetermined pit therebetween, the lower side corner portion comes to be also intermittent one. Accordingly, when the needle-like nozzle 42 opposes to the flexible board 4, the resin is emitted from the needle-like nozzle 42, and the emission of resin is stopped at the position defined between the flexible board 4 and other flexible board 4 neighboring thereto. This operation is controlled also by means of the controller 50, which is provided with the conduit 49, in the same manner as to the needle-like nozzle 22.

Herein, the resin emitted from the needle-like nozzle 42 must be limited to the connecting portion defined between the lower substrate 2 and drawing portions of the flexible boards 4, so that the resin will not go round back to the reverse surface of the lower substrate 2. Since the emission outlet is directed obliquely upward in the needle-like nozzle 42, when the emission is stopped, the resin adheres on this emission outlet in a manner of piling up thereon. And, repeating the emission and the stoppage thereof repetitively results into the pile-up of resin to be large in an amount thereof. Then, preferably, the swing arm is initiated, so as to dip the tip portion of the needle-like nozzle 42 into the solvent tank 55, every time when applying the resin onto one (1) piece of liquid crystal cell 1 or every application of resin onto a plural pieces of the liquid crystal cells 1, depending on the viscosity of the resin, thereby removing the resin attaching on the periphery of the emission outlet. According to this, the resin can be supplied only to the connecting portions in the draw-out portion of the lower substrate 2 from the flexible board 4, with certainty, and the resin will not adhere on portions other than those.

As was mentioned previously, the resin is applied onto the upper side corner portion defined between the upper substrate 3, on the upper side of the lower substrate 2, and also onto the lower side corner defined between the lower side thereof and the flexible board 4, in the liquid crystal cell 1, however this resin is in the dissolving condition, therefore, it adheres onto those corners due to the viscosity thereof. Then, the resin is cured in the succeeding steps. Curing of the resin can be achieved through air-drying. However, for prompting the curing process of resin, it is preferable to select the resin to be supplied, which can be cured under the ultraviolet (UV) rays, and to irradiate the ultraviolet (UV) rays upon the applied portions of the resin, in the succeeding steps thereof.

As was fully explained in the above, according to the present invention, there can be obtain an effect that the resin can be supplied between the edge portion of the lower substrate and the lower surface of the connecting board, smoothly and certainly, but without turning over the panel for display, such as the liquid crystal cell, etc.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A method for applying resin onto an upper side corner defined between a projection portion of a lower substrate and an upper substrate, and a lower side corner of a draw-out portion of the lower substrate from a flexible board, on a panel being made up with two pieces of substrates, in which at least two sides of the lower substrate are projected from the upper substrate and are attached with a plural number of flexible boards at the projection portions of the lower substrate, at a predetermined pitch distance therebwtween, comprising the following steps:

disposing dispensers for applying the resin, at said upper side corner and said lower side corner, under non-contacting condition therewith;

applying the resin directing from each of said dispensers to said upper side corner and said lower side corner, respectively, during when either one of said panel or said dispenser is moved with respect to the other;

applying the resin almost uniformly over a total length of said panel, on the upper side corner; and applying the resin onto each attaching portion of each of said flexible boards, on the lower side corner.

2. A manufacturing method of a panel for display, comprising manufacturing a panel for display by using the panel, on which the resin is applied by means of the resin applying method on a panel described in the above claim 1.

3. A method for applying resin onto an upper side corner defined between a projection portion of a lower substrate and an upper substrate, and a lower side corner of a draw-out portion of the lower substrate from a flexible board, on a panel being made up with two pieces of substrates, in which at least two sides of the lower substrate are projected from the upper substrate and are attached with a plural number of flexible boards at the projection portions of the lower substrate, at a predetermined pitch distance therebetween, comprising the following steps:

disposing dispensers for applying the resin, at said upper side corner and said lower side corner, under non-contacting condition therewith;

applying the resin directing from each of said dispensers to said upper side corner and said lower side corner, respectively, during when either one of said panel or said dispenser is moved with respect to the other, wherein the resin is applied almost uniformly over a total length of the panel on the upper side corner and is applied to each attaching portion of each of the flexible boards on the lower side corner; and drying the resin applied thereon.

4. A manufacturing method of a panel for display, comprising manufacturing a panel for display by using the panel on which the resin is applied by means of the resin applying method on a panel described in the above claim 3.

5. A method for applying resin onto an upper side corner defined between a projection portion of a lower substrate and an upper substrate, and a lower side corner of a draw-out portion of the lower substrate from a flexible board, on a panel for a display being made up with two pieces of substrates, in which at least two sides of the lower substrate are projected from the upper substrate and are attached with a plural number of flexible boards at the projection portion of the lower substrate, at a predetermined pitch distance therebetween, comprising the following steps:

disposing dispensers for applying the resin, at said upper side corner and said lower side corner, under non-contacting condition therewith;

applying the resin directing from each of said upper side corner and said lower side corner, respectively, during when either one of said panel or said dispenser is moved with respect to the other, wherein the resin is applied almost uniformly over a total length of the panel on the upper side corner and is applied to each attaching portion of each of the flexible boards on the lower side corner; and drying the resin applied thereon.

6. The method for applying resin according to claim 5, wherein said panel for a display is made up with said two pieces of substrates encapsulating a liquid crystal material therebetween.

7. A method for applying resin onto an upper side corner defined between a projection portion of a lower substrate and an upper substrate, and a lower side corner of a draw-out portion of the lower substrate from a flexible board, on a panel for a display being made up with two pieces of substrates, in which at least two sides of the lower substrate are projected from the upper substrate and are attached with a plural number of flexible boards at the projection portions of the lower substrate, at a predetermined pitch distance therebetween, comprising the following steps:

disposing dispensers for applying the resin, at said upper side corner and said lower side corner, under non-contacting condition therewith;

applying the resin directing from each of said dispensers to said upper side corner and said lower side corner, respectively, during when either one of said panel or said dispenser is moved with respect to the other;

applying the resin almost uniformly over a total length of said panel, on the upper side corner; and applying the resin onto each attaching portion of each of said flexible boards, on the lower side corner.

8. The method for applying resin according to claim 7, wherein said panel for a display is made up with said two pieces of substrates encapsulating a liquid material therebetween.

* * * * *